United States Patent
Yang

(10) Patent No.: US 8,213,241 B2
(45) Date of Patent: Jul. 3, 2012

(54) MEMORY READOUT SCHEME USING SEPARATE SENSE AMPLIFIER VOLTAGE

(75) Inventor: Chen-Lin Yang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 226 days.

(21) Appl. No.: 12/706,099

(22) Filed: Feb. 16, 2010

(65) Prior Publication Data

US 2011/0199850 A1    Aug. 18, 2011

(51) Int. Cl.
   *G11C 7/00*    (2006.01)
(52) U.S. Cl. .......... 365/189.11; 365/189.09; 365/189.16
(58) Field of Classification Search ............. 365/189.11, 365/189.09, 205, 206, 189.16
See application file for complete search history.

(56) References Cited

U.S. PATENT DOCUMENTS

| | | | |
|---|---|---|---|
| 6,535,435 B2 * | 3/2003 | Tanaka et al. | 365/189.09 |
| 6,795,355 B2 | 9/2004 | Ooishi | |
| 6,977,850 B2 * | 12/2005 | Tanzawa | 365/189.11 |
| 7,474,582 B2 | 1/2009 | Mair et al. | |

* cited by examiner

*Primary Examiner* — Son Dinh
(74) *Attorney, Agent, or Firm* — Lowe, Hauptman, Ham & Berner, LLP

(57) ABSTRACT

A memory includes a memory cell coupled to a data line. A sense amplifier is coupled to the data line. A power supply node has a first voltage. The first voltage is provided to the sense amplifier. A charge pump circuit is coupled to the sense amplifier. The charge pump circuit is configured to provide a second voltage to the sense amplifier when a read operation is performed.

20 Claims, 5 Drawing Sheets

US 8,213,241 B2

MEMORY READOUT SCHEME USING SEPARATE SENSE AMPLIFIER VOLTAGE

TECHNICAL FIELD

The present disclosure relates generally to integrated circuits, more particularly memory circuits.

BACKGROUND

Single-ended readout structures can be found in memories including read-only memory (ROM), random access memory (RAM), or other multiple-port register files designed for the simplicity of readout structures. In some approaches, the single-ended readout is also free from a sense amplifier (SA) pair device mismatch associated dual-ended readout. However, the noise margin window for a read "0" operation (actively pulling low) is generally smaller than the window for a read "1" (remaining at a pre-charged state).

In order to balance the read "0" and read "1" noise margin windows, the logic gate used for sensing is usually "high skewed" (higher P/N ratio, i.e., $I_{sat\_P}/I_{sat\_N}$) to change a trip point (i.e., the input voltage level where the output is decided as either a logical 0 or a logical 1) of the sense amplifier. For example, different device sizing, PMOS parallelism, or NMOS stacking can be used to change the P/N ratio. However, the effectiveness of this approach is very limited. A trip point of a sense amplifier is a function of the threshold voltages of NMOS/PMOS devices, which cannot be simply controlled by changing the P/N ratio. Also, the PMOS parallelism causes a large area penalty, and stacking NMOS not only needs a larger area, but also can cause contention for a data line between a pull-down device and a precharge device. In one example, increasing the P/N ratio from 2 to 7 only increases the input logical 1 voltage level, i.e., the trip point, about 60 millivolts (mV).

In another approach for the readout improvement, a dual-rail structure uses a separate higher power supply voltage for a memory cell array. The dual-rail scheme for the power supply voltage needs a separate power for the whole memory array, which generates another large power domain/net that uses a large amount of power bumps and metal tracks. A large power net requires significant additional efforts to improve the voltage drop (IR) and electromigration (EM) associated with the large power net. It is impractical to do a dynamic read-write assist by manipulating a large power net, because the slow responses are not fit for memory operations. Further, cross-power domain level shifters are needed that causes certain timing skews (delays). The cross-power domain isolation also needs special care in design and fabrication.

Accordingly, new methods are desired to solve the above problem.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
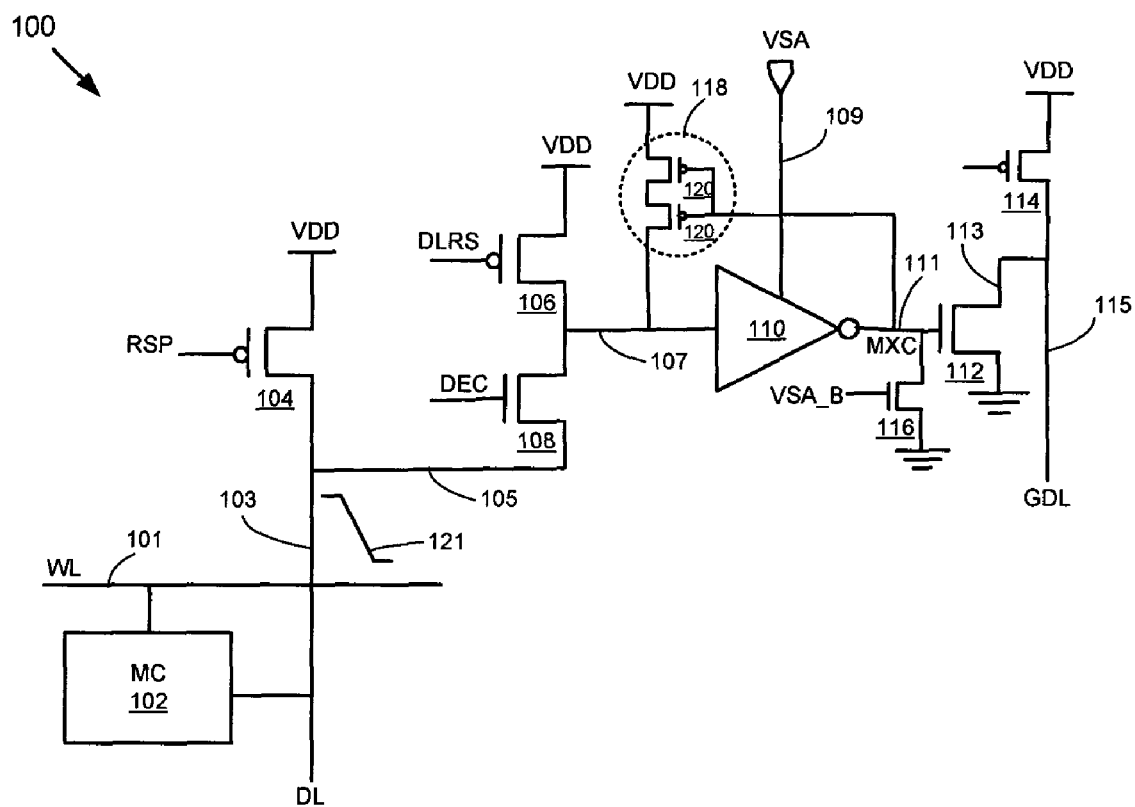
FIG. 1 is a schematic diagram of an exemplary memory circuit with a separate sense amplifier voltage.

FIG. 1 is a schematic diagram of an exemplary memory circuit with a separate sense amplifier voltage. The memory 100 includes a memory cell 102 coupled to a data line DL 103. The memory 100 is provided with a first voltage, e.g., VDD. The memory cell 102 stores information for a bit, i.e., a logical 1 or a logical 0. The PMOS transistor 104 is coupled to a precharge signal RSP, i.e., read data line reset, to precharge DL 103 to a logical 1 for a read operation.

A readout cycle for the memory 100, either a logical 0 ("Read 0") or a logical 1 ("Read 1") starts by precharging the DL 103 to a logical 1, e.g., VDD, by keeping RSP to a logical 0 and enabling the PMOS transistor 104. Then a word line WL 101 is asserted to access the memory cell 102. Assuming that the stored bit information is a logical 0 (Read 0), the bit information is transferred to the DL 103 by allowing DL 103 to discharge (pulled-down), as the simplified waveform 121 shows. A decode signal DEC coupled to the gate of the NMOS transistor 108 selects a column in a memory array. Assuming that the column for the memory cell 102 is chosen for a read operation, the NMOS transistor 108 is turned on. A data line reset signal DLRS coupled to the gate of a PMOS transistor 106 is at a logical 1 during a readout, which turns off the PMOS transistor 106.

The input 107 to a sense amplifier 110 follows the voltage level change of the discharging DL 103 coupled to the NMOS transistor 108 through the connection 105. The sense amplifier voltage VSA 109 can be supplied by VDD, when VSA is not increased during the read operation. In this example, the sense amplifier 110 is implemented using an inverter. As an input to the inverter changes its voltage level, the inverter provides an inverted output before the input voltage level changes fully from a logical 1 to a logical 0, or vice versa. Therefore, the inverter detects (i.e., senses) the partial voltage level change of the input and provides a full voltage level change of the output (i.e., amplification). The sense amplifier 110 is coupled to a pull down NMOS transistor 112. In another example, the sense amplifier 110 is implemented using a NAND gate. The function of the NAND gate as a sense amplifier is similar to the inverter described above. It is noted that there can many various embodiments using different implementations.

Figure 2:
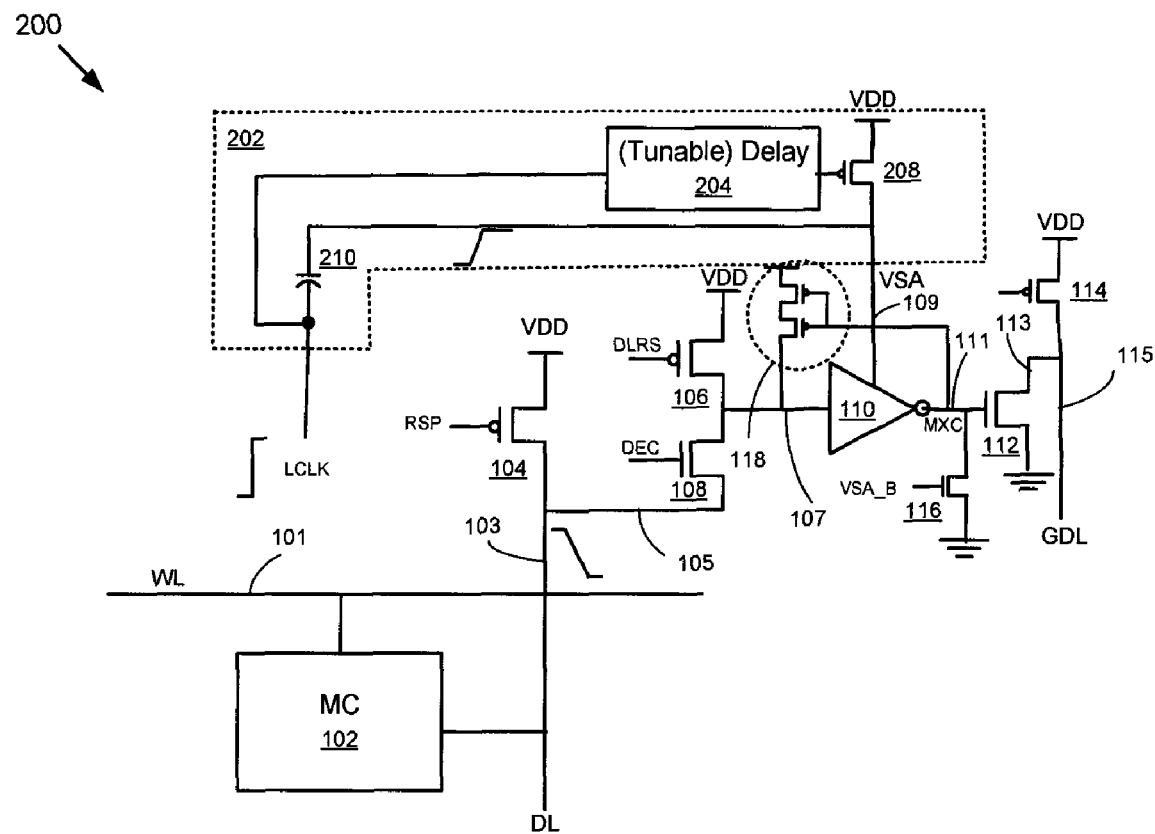
FIG. 2 is an exemplary embodiment utilizing the memory circuit shown in FIG. 1.

During a read operation of the memory 100, a VSA separate from VDD is used for the sense amplifier 110 when VSA is increased from VDD to a second voltage to improve the Read 0 performance by balancing the Read 0 and Read 1 noise margin. For example, as shown in FIG. 2, a charge pump circuit 202 can be coupled to the sense amplifier 110 that is configured to provide the increased VSA to the sense amplifier 110 when a read operation is performed.

The keeper circuit 118 keeps the DL 103 high unless DL is pulled down during a Read 0. In this example, PMOS transistors 120 are used in the keeper circuit 118. When reading a logical 0, the inverted read output MXC 111 from the sense amplifier 110 will be a logical 1, therefore turning off the keeper circuit 118. With the read output 111 at a logical 1, a pull down NMOS transistor 112 is turned on, which discharges the global data line GDL 115 to a logical 0. Embodiments of the memory 100 using the VSA separate from VDD (the VSA is increased during a read operation) for the sense amplifier 110 has improved performance when reading a logical 0, e.g., a faster response time, as explained below under FIG. 3.

A PMOS transistor 114 is used to precharge the GDL 115 prior to a read operation. A pull down NMOS transistor 116 can be used to asynchronously reset the read output 111 to a logical 0 by asserting VSA_B (an inverted signal of VSA) to a logical 1 (i.e., by driving VSA to a logical 0). This will reset the read output 111 to a precharged state regardless of free-running inputs and provides another power-saving mode with almost instant recovery.

When the bit information in the memory cell 102 is a logical 1, the DL 103 does not discharge and the keeper circuit 118 keeps the DL at a logical 1. Also, the read output 111 is a logical 0 and the pull down NMOS transistor 112 is turned off. Therefore, the GDL 115 precharged by the PMOS transistor 114 is also kept at a logical 1.

FIG. 2 is an exemplary embodiment utilizing the memory circuit shown in FIG. 1. The memory 200 shows a charge pump circuit 202 that provides VSA through 109 to the sense amplifier 110. The charge pump circuit 202 is connected to VDD. A local clock LCLK provides a pulse signal to control the charge pump circuit 202. In one example, the pulse signal is a word line signal. When the LCLK is at a logical 0 (low voltage), it is transferred through a delay 204 and turns on the PMOS transistor 208. The delay 204 can be a fixed delay, e.g., cascaded inverters, or a tunable delay. The delay 204 is used such that the VSA boost, i.e., a higher sense amplifier voltage, can be synchronized with the start of a read operation for better efficiency. A coupling capacitor 210 is charged to VDD through the PMOS transistor 208 and the VSA at 109 is kept at VDD.

When the LCLK changes to at a logical 1 (high voltage) for a read operation, the PMOS transistor 208 is turned off. The charged up capacitor 210 tends to retain the voltage across it (or the charge stored) at the beginning and provides a boosted VSA that is higher than VDD to the sense amplifier 110. In one example, by increasing VSA about 250 mV from VDD, the input high voltage level, i.e., the trip point, of the sense amplifier 110 increased about 150 mV, compared to only about 60 mV increase when changing a P/N ratio of the sense amplifier 110 from 2 to 7. In some embodiments, VSA can be raised to two times VDD minus a noise margin for Read 1 (e.g., 2×VDD−100 mV), and still remain robust enough from a Read 1 noise margin point of view. In another embodiment, the upper limit of VSA can be set at 1.2 times of nominal VDD, in consideration of device reliability concerns (e.g., reliable function under higher voltage).

In some embodiments, the VSA is implemented without having another power supply, and the loading of the power net can be kept low (i.e., low capacitance) compared to the power net of another power supply. Some embodiments enable a dynamic power adjustment, because VSA is boosted when a read operation is performed. Compared to inserting level shifters in other approaches, the embodiments using the charge pump circuit 202 can reduce area overhead and timing skew (delay) concerns by not using level shifters. Because all control signals of the memory 200 can be still in the VDD domain, the dual-rail part can be limited to a smaller power net.

Figure 3:
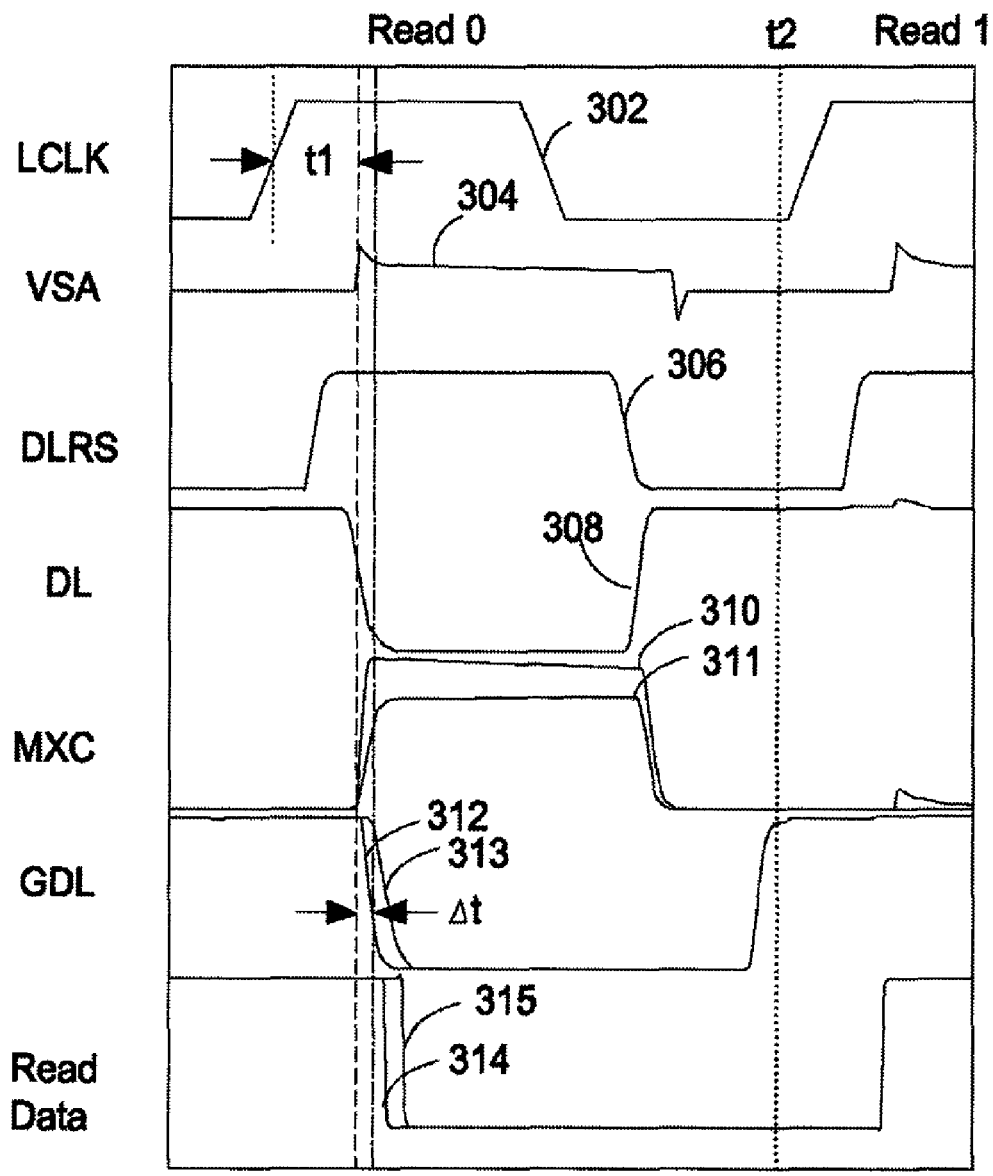
FIG. 3 is a plot showing various exemplary waveforms of the memory circuit shown in FIG. 2.

FIG. 3 is a plot showing various exemplary waveforms of the memory circuit shown in FIG. 2. The LCLK waveform 302 shows that LCLK begins at a logical 0 and then is asserted to a logical 1 for a Read 0 operation, i.e., the bit information to be read from the memory cell 102 is a logical 0. Afterwards, LCLK returns back to a logical 0 and then is asserted again to a logical 1 for a Read 1 operation. For the Read 0, after a time delay t1 from LCLK assertion, VSA 304 is boosted, i.e., increased, from VDD to a higher value. Adjusting the delay 204 in the charge pump circuit 202 can control the time delay t1. The DLRS 306 waveform shows that the precharge through the PMOS transistor 106 stops (i.e., DLRS becomes high) after LCLK is asserted, but before the VSA is boosted.

The DL 308 shows the transition from a precharged state (logical 1) to a logical 0 as the DL 308 is pulled down according to the bit information (logical 0). The read output signal MXC 310 (using a boosted VSA for the sense amplifier) and 311 (using VDD for the sense amplifier) show the transition of the inverted readout from a logical 0 to a logical 1 as the DL 308 is pulled down. The MXC 310 using a boosted VSA according to the circuit 200 in FIG. 2 shows a faster response compared to the MXC 311 without using a boosted VSA. The GDL 312 (using a boosted VSA for the sense amplifier) and 313 (using VDD for the sense amplifier) show the transition of the readout from logical 1 to logical 0 as the pulled down NMOS transistor 112 pulls down the GDL. The GDL 312 using a boosted VSA according to the circuit 200 in FIG. 2 shows a faster response by t compared to the GDL 313 without using a boosted VSA. In one example, t is measured at about 60 ps. The final digital read data 314 (using a boosted VSA for the sense amplifier) and 315 (using VDD for the sense amplifier) also show that the read data 314 using a boosted VSA according to the circuit 200 in FIG. 2 has a faster response compared to the read data 315 without using a boosted VSA.

At the time point t2, the waveforms in FIG. 3 show the signal states just before the Read 1 operation begins. LCLK 302 is back to a logical 0 before it is asserted for a Read 1 operation. The VSA 304 is back to VDD. The DLRS 306 is at logical 0 to enable the PMOS transistor 106 for the data line reset (precharge). The DL 308 shows that it is precharged to logical 1. The MXC 310 and 311 are back to logical 0. The GDL 312 and 313 are back to logical 1. (The read data 314 and 315 remain at logical 0 until a different value is read.) Since the precharged DL 308 remains at the precharged state for Read 1 (a logical 1), there is no transition necessary for DL 308, MXC 310 and 311, GDL 312 and 313. Therefore, there is no difference in the response time between the circuit 200 using a boosted VSA for the sense amplifier and another circuit using VDD for the sense amplifier. The read data 314 and 315 change to logical 1 without any time difference between them.

Figure 4:
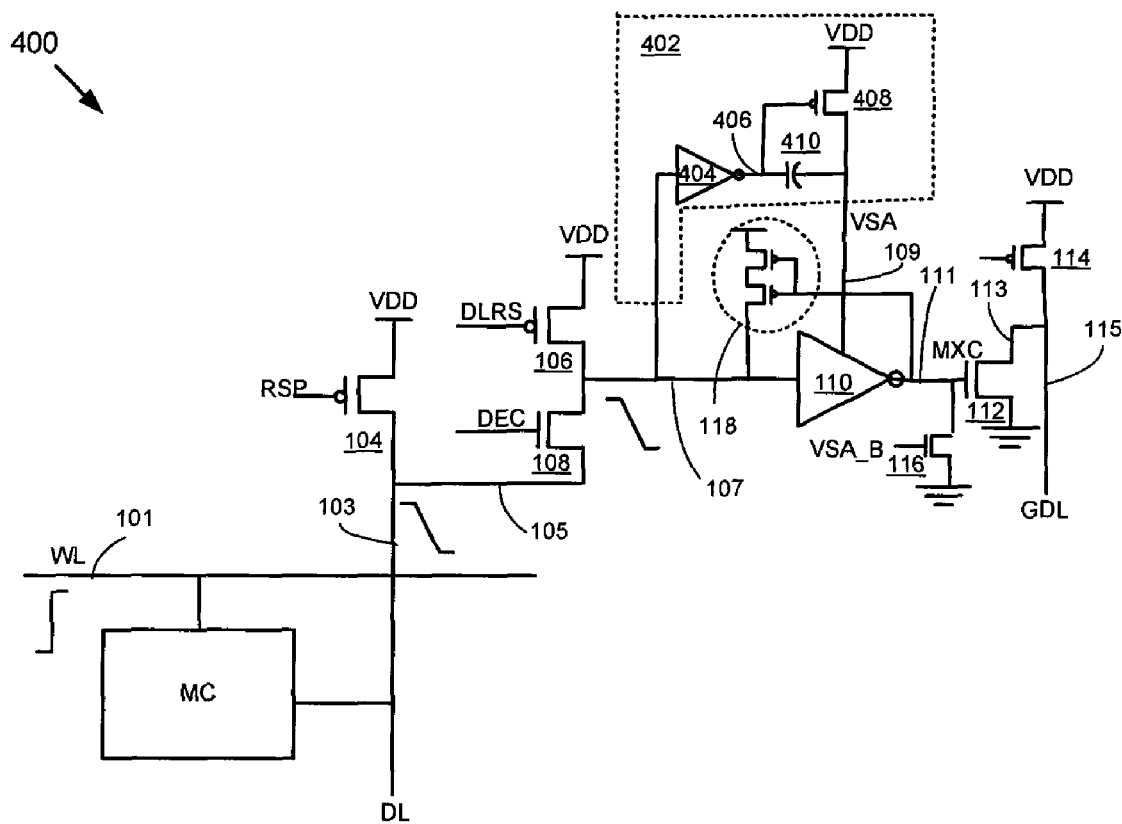
FIG. 4 is another exemplary embodiment utilizing the memory circuit shown in FIG. 1.

FIG. 4 is another exemplary embodiment utilizing the memory circuit shown in FIG. 1. In this embodiment, the charge pump circuit 402 is coupled to the sense amplifier input signal 107 instead of the LCLK (as shown in FIG. 2). The charge pump circuit 402 provides the boosted VSA when the read operation is for reading a logical 0. For a Read 0 operation, when DL 103 and the signal 107 are at a precharged state at a logical 1, an inverter 404 enables a PMOS transistor 408 and the sense amplifier 110 is supplied with VSA that is equal to VDD. A capacitor 410 is charged to VDD. In one example, the inverter 404 is a high-skewed inverter for symmetrical pull up/pull down.

As the DL 103 and the signal at 107 are pulled down to a logical 0 for the Read 0 operation, the inverter output 406 is changed to a logical 1 (VDD) that disables the PMOS transistor 408. The charged up capacitor 410 tends to retain the voltage across it (or the charge stored) at the beginning and provides a boosted VSA that is higher than VDD to the sense amplifier 110. For a Read 1 operation, the DL 103 and the signal at 107 remain at the precharged state (a logical 1), thus the charge pump circuit 400 does not provide a boosted VSA.

Figure 5:
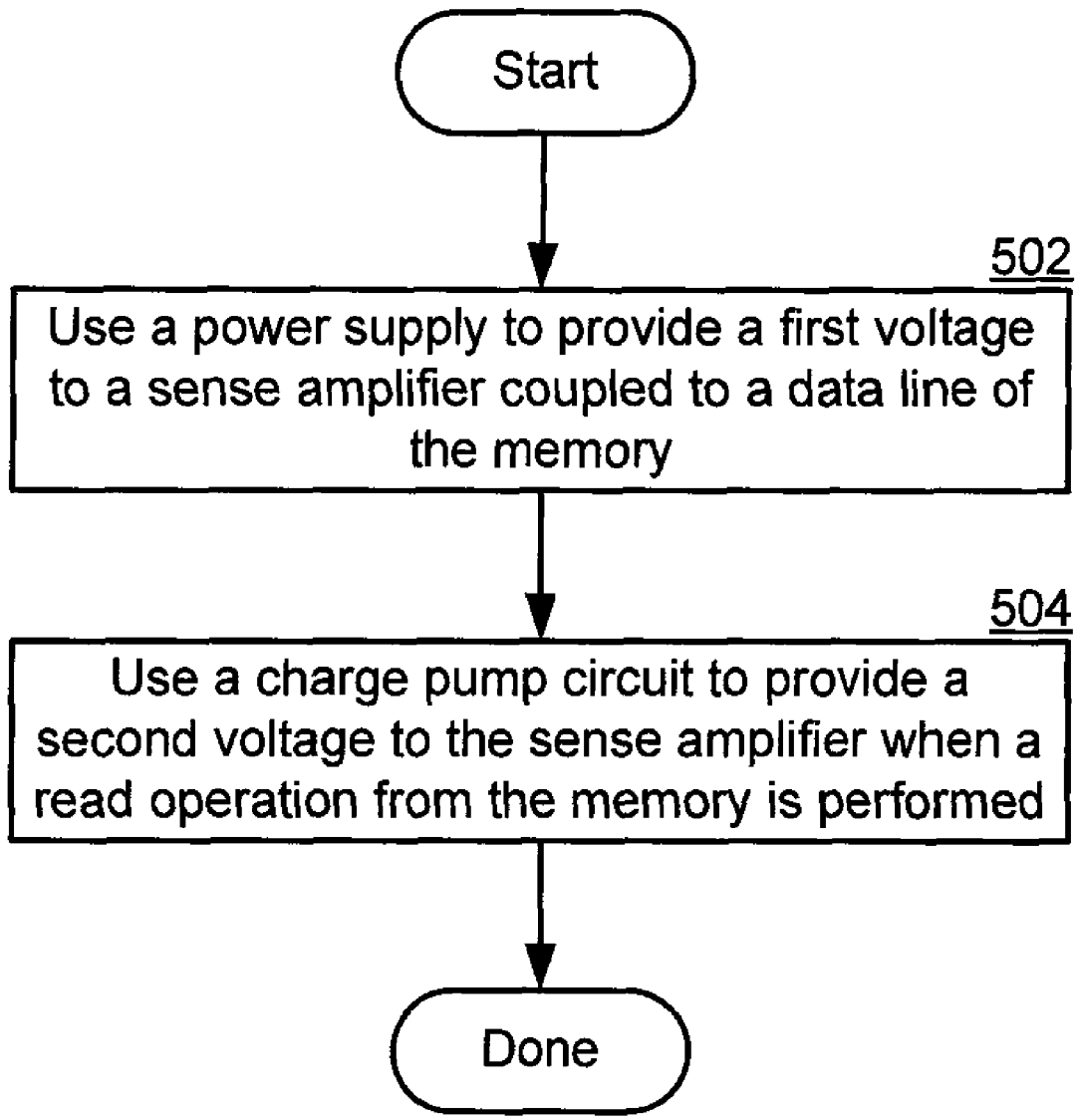
FIG. 5 is a flowchart showing an exemplary method for utilizing the memory circuit shown in FIG. 1.

FIG. 5 is a flowchart showing an exemplary method utilizing the memory circuit shown in FIG. 1. At step 502, a power supply is used to provide a first voltage, e.g., VSA equal to VDD, to a sense amplifier 110. The sense amplifier 110 is coupled to a data line 103 of the memory 100. At step 504, a charge pump circuit, e.g. 202 shown in FIG. 2, is used to provide a second voltage, e.g., a boosted VSA, to the sense amplifier 110 when a read operation from the memory 110 is performed. In one embodiment, the charge pump circuit, e.g., 402, provides the second voltage when the read operation is for reading a logical 0.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory, comprising:
a data line;
a memory cell coupled to the data line;
a sense amplifier coupled to the data line;
a power supply node having a first voltage provided to the sense amplifier;
a charge pump circuit coupled to the sense amplifier and configured to provide a second voltage to the sense amplifier when a read operation from the memory cell is performed; and
a pull down NMOS transistor coupled to the sense amplifier for asynchronous output reset.

2. The memory of claim 1, wherein the charge pump circuit is controlled by a pulse signal.

3. The memory of claim 2, wherein the pulse signal is a word line signal.

4. The memory of claim 1, wherein the charge pump circuit provides the second voltage when the read operation is for reading a logical 0.

5. The memory of claim 1, wherein the charge pump circuit is coupled to an input to the sense amplifier.

6. The memory of claim 1, wherein the sense amplifier is an inverter or a NAND gate.

7. The memory of claim 1, wherein the charge pump circuit comprises a tunable delay, a PMOS transistor, and a capacitor, the tunable delay is configured to synchronize the second voltage and the read operation, and the PMOS transistor enables the capacitor to be charged prior to the read operation.

8. The memory of claim 1, wherein the charge pump circuit comprises an inverter, a PMOS transistor, and a capacitor, the inverter enables the PMOS transistor for reading a logical 0, and the PMOS transistor enables the capacitor to be charged prior to the read operation.

9. The memory of claim 8, wherein an input to the inverter is coupled to an input to the sense amplifier.

10. A method for improving readout of a memory, comprising:
supplying a first voltage from a power supply to a sense amplifier coupled to a data line of the memory; and
supplying a second voltage from a charge pump circuit to the sense amplifier when a read operation from the memory is performed, wherein the charge pump is controlled by a pulse signal, and the pulse signal is a word line signal.

11. The method of claim 10, wherein the charge pump circuit supplies the second voltage when the read operation is for reading a logical 0.

12. The method of claim 10, wherein the charge pump circuit is coupled to an input to the sense amplifier.

13. The method of claim 10, further comprising enabling a pull down NMOS transistor coupled to the sense amplifier for an asynchronous output reset.

14. The method of claim 10, wherein the charge pump circuit comprises a tunable delay, a PMOS transistor, and a capacitor, the tunable delay is configured to synchronize the second voltage and the read operation, and the PMOS transistor enables the capacitor to be charged prior to the read operation.

15. The method of claim 10, wherein the charge pump circuit comprises an inverter, a PMOS transistor, and a capacitor, the inverter enables the PMOS transistor for reading a logical 0, and the PMOS transistor enables the capacitor charged prior to the read operation.

16. A memory, comprising:
a data line;
a memory cell coupled to the data line;
a sense amplifier coupled to the data line;
a power supply node having a first voltage provided to the sense amplifier; and
a charge pump circuit coupled to the sense amplifier and configured to supply a second voltage to the sense amplifier when the read operation is performed, wherein a pulse signal controls the charge pump circuit, the charge pump circuit comprises an inverter, a PMOS transistor, and a capacitor, the inverter enables the PMOS transistor for a read operation, and the PMOS transistor enables the capacitor to be charged prior to the read operation.

17. The memory of claim 16, wherein the charge pump circuit provides the second voltage when the read operation is for reading a logical 0.

18. The memory of claim 16, wherein the sense amplifier is an inverter or a NAND gate.

19. The memory of claim 16, wherein the sense amplifier is coupled to a pull down NMOS transistor for asynchronous output rest.

20. The memory of claim 16, wherein the charge pump is controlled by a pulse signal, and the pulse signal is a word line signal.

* * * * *